(12) United States Patent
Green et al.

(10) Patent No.: US 6,867,078 B1
(45) Date of Patent: Mar. 15, 2005

(54) METHOD FOR FORMING A MICROWAVE FIELD EFFECT TRANSISTOR WITH HIGH OPERATING VOLTAGE

(75) Inventors: Bruce M. Green, Gilbert, AZ (US); Olin L. Hartin, Phoenix, AZ (US); Lawrence S. Klingbeil, Chandler, AZ (US); Ellen Y. Lan, Chandler, AZ (US); Hsin-Hua P. Li, Scottsdale, AZ (US); Charles E. Weitzel, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/716,955

(22) Filed: Nov. 19, 2003

(51) Int. Cl.⁷ .................... H01L 21/338; H01L 21/3205
(52) U.S. Cl. .................. 438/167; 438/172; 438/175; 438/182; 438/285; 438/590; 257/183; 257/192; 257/194; 257/195
(58) Field of Search ................ 438/167, 172, 438/175, 182, 285, 571–579, 590; 257/192, 183, 194, 195

(56) References Cited

U.S. PATENT DOCUMENTS

| | | | |
|---|---|---|---|
| 4,551,905 A | | 11/1985 | Chao et al. |
| 5,281,839 A | | 1/1994 | Cambou et al. |
| 5,374,835 A | | 12/1994 | Shimada et al. |
| 5,399,886 A | | 3/1995 | Hasegawa |
| 6,479,896 B1 | * | 11/2002 | Tanabe ................ 257/745 |
| 6,483,135 B1 | | 11/2002 | Mizuta et al. |
| 6,521,961 B1 | * | 2/2003 | Costa et al. ........... 257/402 |
| 6,627,473 B1 | * | 9/2003 | Oikawa et al. ........ 438/46 |

OTHER PUBLICATIONS

Wakejima, Akio et al.; "A GaAs–Based Field–Modulating Plate HFET with Improved WCDMA Peak–Output–Power Characteristics"; IEEE Transactions on Electron Devices; Sep., 2003; pp 983–1987; vol. 50, No. 9; IEEE.

Okamoto, Yasuhiro et al.; "An 80W AlGaN/GaN Heterojunction FET with a Field–Modulating Plate"; IEEE MTT–S Digest, 2003; pp 225–228; IEEE.

Wakejima, Akio et al.; "Field–Modulating Plate (FP) InGaP MESFET with High Breakdown Voltage and Low Distortion", IEEE Radio Frequency Integrated Circuit Symposium; 2001; pp 151–154; IEEE.

Sakura, N. et al.; "100W L–Band GaAs Power FP–HFET Operated at 30V"; IEEE MTT–S Digest; 2000; pp 1715–1718; IEEE.

Hara, Naoki et al.; "Low–Distrotion GaAs–Based Field Effect Transistors with InGaP Channel Layer for High–Voltage Operation"; IEDM; 1998; pp 3.4.1–3.4.4; IEEE.

\* cited by examiner

*Primary Examiner*—Donghee Kang
(74) *Attorney, Agent, or Firm*—Robert L. King; Michael Bolconi-Lamica

(57) ABSTRACT

A microwave field effect transistor (10) has a high conductivity gate (44) overlying a double heterojunction structure (14, 18, 22) that has an undoped channel layer (18). The heterojunction structure overlies a substrate (12). A recess layer that is a not intentionally doped (NID) layer (24) overlies the heterojunction structure and is formed with a predetermined thickness that minimizes impact ionization effects at an interface of a drain contact of source/drain ohmic contacts (30) and permits significantly higher voltage operation than previous step gate transistors. Another recess layer (26) is used to define a gate dimension. A Schottky gate opening (42) is formed within a step gate opening (40) to create a step gate structure. A channel layer (18) material of $In_xGa_{1-x}As$ is used to provide a region of electron confinement with improved transport characteristics that result in higher frequency of operation, higher power density and improved power-added efficiency.

30 Claims, 5 Drawing Sheets

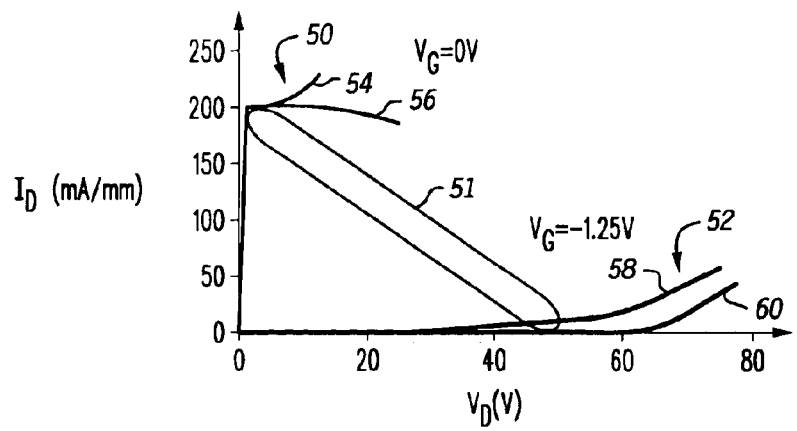
*FIG. 9*
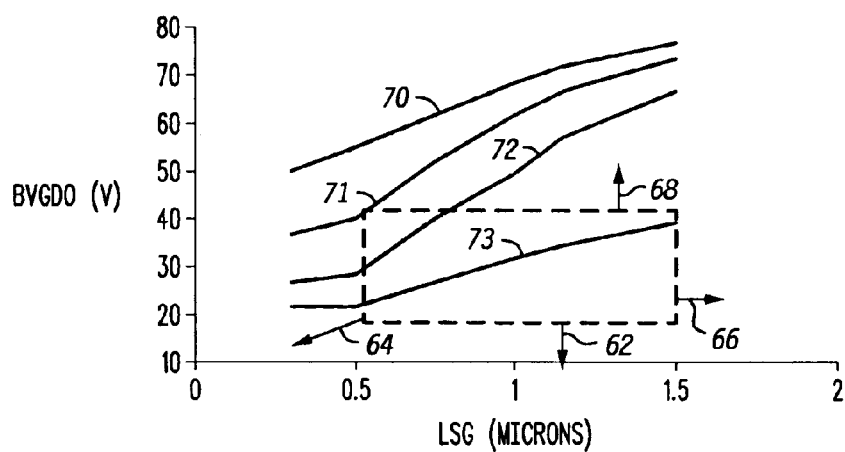
*FIG. 10*
| STEP GATE LENGTH (μm) | GAIN (MAX POWER TUNING) (dB) | PSAT (MAX POWER TUNING) (W/mm) | PAE (MAX POWER TUNING) (%) | IG@SMALL SIGNAL (mA/mm) | BVGDO (V) |
|---|---|---|---|---|---|
| 0.5 | 11.5 | 1.71 | 58 | -0.7 | 24 |
| 0.8 | 11 | 1.67 | 57 | -0.1 | 31 |
| 1.2 | 10.2 | 1.53 | 53 | -0.005 | 37 |
*FIG. 11*   80

METHOD FOR FORMING A MICROWAVE FIELD EFFECT TRANSISTOR WITH HIGH OPERATING VOLTAGE

FIELD OF THE INVENTION

This invention relates to semiconductors, and more particularly to transistors for high frequency operation.

RELATED ART

Microwave transistors are required to operate at ever increasing frequencies with increased demands on power handling capability. For example, transistors that operate in frequency ranges in the multiple GHz range at voltages well in excess of twenty volts are increasingly needed. Compound semiconductors which combine more than one kind of atom in the semiconductor material from groups III–V or II–VI of the periodic table of elements, are the material system of choice for high frequency, high efficiency communication applications. In contrast to compound semiconductors, semiconductors that utilize silicon are more frequently used. However, silicon-based semiconductors are limited in frequency range of operation due to inherent electron transport properties of silicon. A known transistor that has a silicon substrate is the silicon LDMOS (Lateral Double-Diffused Metal Oxide Semiconductor) transistor. While typical LDMOS transistors are able to operate with bias voltages well in excess of twenty volts, such transistors are limited to frequencies no greater than the low GHz range (e.g. up to 3 GHz). As a result, the operating efficiency of known LDMOS transistors is less than desired for many modern communication systems. Therefore, others have focused on extending the operating voltage of compound semiconductor devices.

One proposed compound semiconductor device utilizes a structure known as a step gate transistor. Such transistors are also referred to as field-plate transistors. A common feature of a step gate transistor is a gate having two regions in the vicinity of the gate. A first region is a Schottky junction to the channel region. A second region is an extension of a gate metal extending toward a drain over a dielectric region to create significant depletion of the semiconductor surface between the Schottky junction and the drain. While some known step gate transistors operate at voltages above twenty volts, such transistors operate at a low power density and low efficiency. Because of such limitations of compound semiconductor devices, LDMOS transistors are typically commercially used more prevalently for microwave applications than compound semiconductor devices.

BRIEF DESCRIPTION OF THE DRAWINGS

The present invention is illustrated by way of example and not limited by the accompanying figures, in which like references indicate similar elements, and in which:

FIG. 9 illustrates in graphical form a plot of drain current versus drain voltage for differing thicknesses of a recess layer of the field effect transistor of FIGS. 1–8;

FIG. 10 illustrates in graphical form a plot of optimized step gate length and recess layer thickness for the microwave field effect transistor of FIGS. 1–8; and FIG. 11 illustrates in table form various operating characteristics of the microwave field effect transistor of FIGS. 1–8 for specific step gate lengths.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
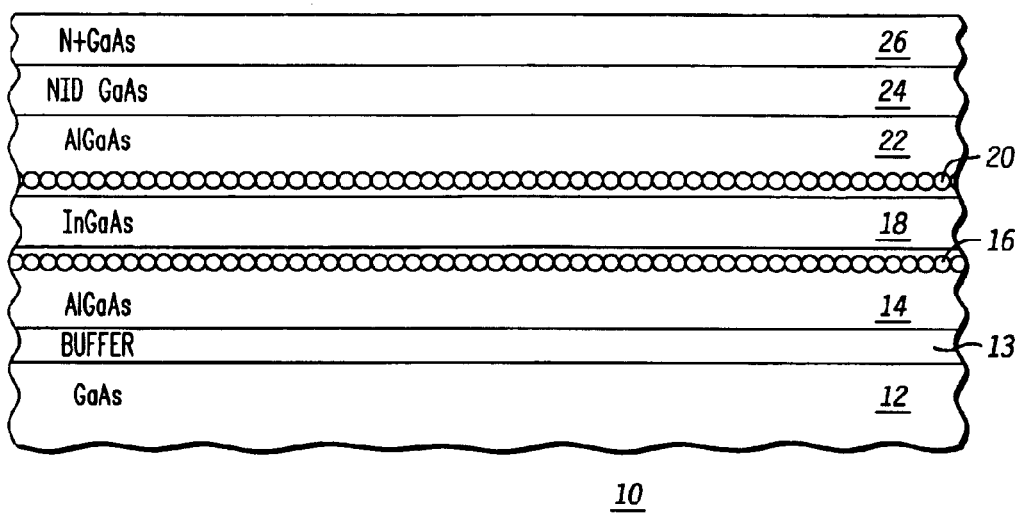
FIGS. 1–8 illustrate in cross-sectional form a process for forming a high voltage microwave field effect transistor and the associated structures.

Illustrated in FIG. 1 is a cross-section of a microwave field effect transistor 10 in accordance with the present invention. A substrate 12 is provided wherein the substrate is preferably formed of GaAs. In other forms, it should be understood that substrate 12 may be formed of any material that is a compound semiconductor material system such as InP, GaN, etc. Overlying substrate 12 is a buffer layer 13. In one form, the buffer layer is formed of a plurality of alternating material layers or a single material. Buffer layers overlying GaAs substrates are well documented in the literature. Overlying buffer layer 13 is a backside barrier layer 14. In one form, the backside barrier layer 14 is formed of $Al_xGa_{1-x}As$, although other compound semiconductor materials may be used, such as $Al_xGa_{1-x}N$ or $In_xGa_{1-x}P$. Here "x" refers to the Al mole fraction and has a value between zero and unity. Near the interface between backside barrier layer 14 and an overlying channel layer 18 is a lower planar doping layer 16. The lower planar doping layer 16 has one or several atomic layers of dopant atoms. The overlying channel layer 18 is formed of Indium Gallium Arsenide ($In_xGa_{1-x}As$) where "x" refers to the indium mole fraction and ranges between zero and unity. $In_xGa_{1-x}As$ is a particularly advantageous material for use in the channel of microwave field effect transistor 10. In particular, $In_xGa_{1-x}As$ is a material having a smaller bandgap and higher electron mobility than the $Al_xGa_{1-x}As$ backside and frontside barrier layers 14 and 22. The speed enhancement from this higher mobility is particularly advantageous as compared with previously used doped GaAs transistor channels. It should be understood that materials other than $In_xGa_{1-x}As$ may be used. For example, for a GaN based transistor, $In_xGa_{1-x}N$ may be used for the channel material. The interface between channel layer 18 and backside barrier layer 14 forms a heterojunction structure on the substrate 12. Overlying the channel layer 18 is a barrier layer 22. The barrier layer 22, in one form, is composed of $Al_xGa_{1-x}As$. Other materials from Groups III–V may be used for barrier layer 22, such as $In_xGa_{1-x}P$ or $In_xGa_{1-x}P$. Within barrier layer 22 is an upper planar doping layer 20 that has one or more atomic layers of dopant atoms. The upper planar doping layer 20 forms a second heterojunction with an upper surface of the channel layer 18. Dopant atoms within each of the lower planar doping layer 16 and the upper planar doping layer 20 may be any of silicon, selenium, and tellurium, as well as other materials. With doping on either side of the channel, electrons from the dopant atoms are thermally excited and enter the channel since the channel is a region with a lower conduction band energy. Overlying the barrier layer 22 is a Not Intentionally Doped (NID) layer 24 overlying the second heterojunction. The NID layer 24 functions as a second recess layer because in subsequent processing the NID layer 24 will be the second layer within microwave field effect transistor 10 to be selectively recessed. In one form the NID layer 24 is formed of GaAs. Backside barrier layer 14, channel layer 18 and barrier layer 22 with upper planar doping layer 20 and lower planar doping layer 16 form a double heterojunction 25 without a doped channel. The backside barrier layer 14 and the barrier layer 22 each function as a cladding layer. Overlying the NID layer 24 is a first recess layer 26 because first recess layer 26 will subsequently be the first layer to be selectively recessed. In one form, the first recess layer 26 is a heavily doped semiconductor layer such as N-type GaAs. Therefore, with subsequent processing some of the doping from first recess layer 26 will, to some degree, diffuse into NID layer 24 so that NID layer 24 ultimately will, to some degree, become lightly doped. Other materials, such as any semiconductor layer from Group III–V may be used for the first recess layer 26. The first recess layer 26 will later provide an improved ohmic contact to the channel layer 18 of microwave field effect transistor 10 and is used to form source and drain regions of microwave field effect transistor 10. It should be understood that each of the layers illustrated in FIG. 1 may be formed by growth techniques such as MBE (Molecular Beam Epitaxy) or MOCVD (Metal Organic Chemical Vapor Deposition) in a reactor.

Figure 2:
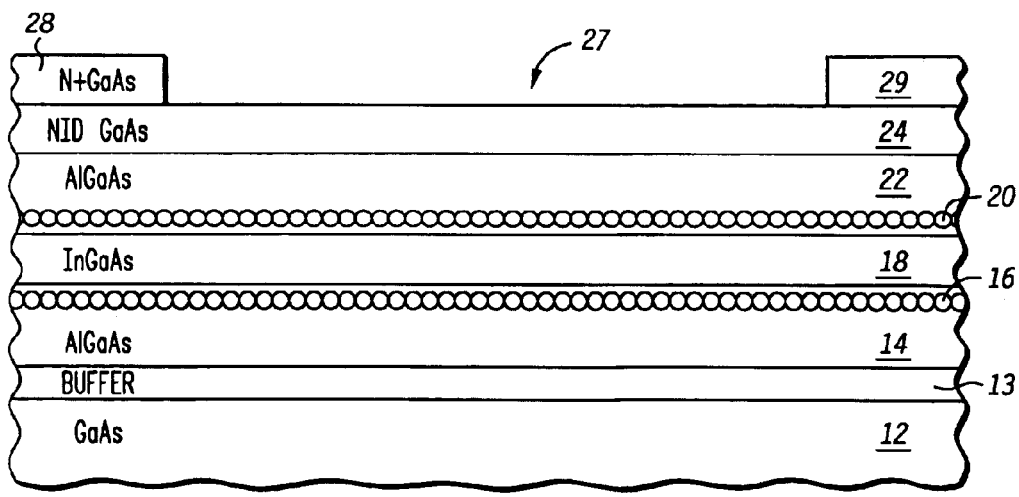

Illustrated in FIG. 2 is microwave field effect transistor 10 wherein a first recess 27 is formed within the heavily doped semiconductor layer. The first recess 27 is typically formed by conventional wet chemical etching technology. The first recess 27 divides the first recess layer 26 to create a source region 28 and a drain region 29. The first recess 27 extends from the source region 28 to the drain region 29 of the microwave field effect transistor 10. The width of the first recess 27 is chosen to provide adequate breakdown voltage, BVGDO (Breakdown Voltage of Gate/Drain in the Off state), of microwave field effect transistor 10 while not degrading transistor performance by making the length too wide.

Figure 3:
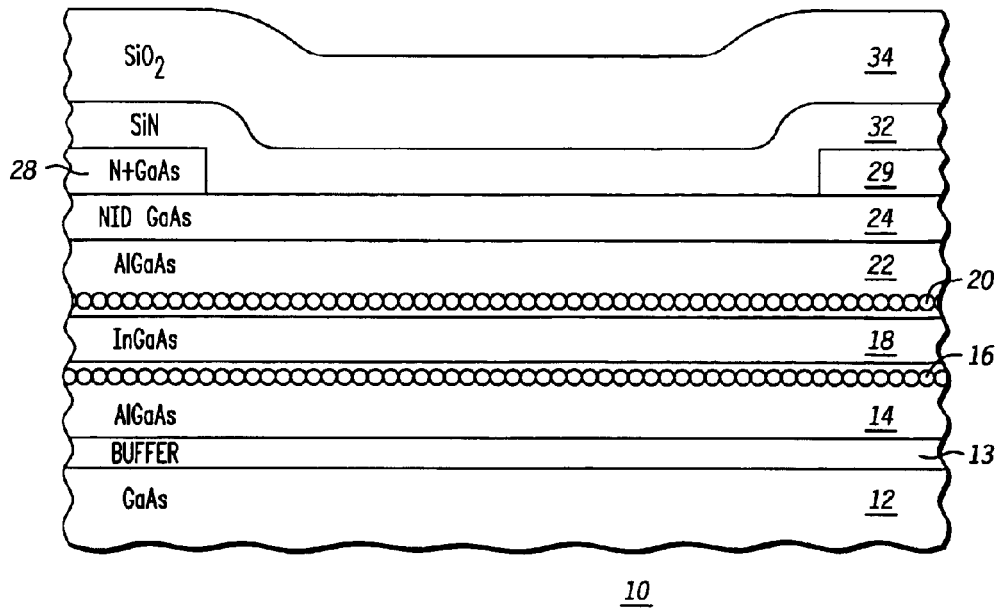

Illustrated in FIG. 3 is further processing of microwave field effect transistor 10 wherein a first dielectric or step gate dielectric 32 is provided overlying the NID layer 24 within the first recess 27 and overlying source region 28 and drain region 29. In one form, the step gate dielectric 32 is SiN. An interlevel dielectric 34 having a thickness on the order of 500–20,000 Angstroms is formed overlying the step gate dielectric 32. In one form the interlevel dielectric 34 is formed of $SiO_2$ and is used to form the gate of microwave field effect transistor 10. As will be detailed below, the step gate dielectric 32 and interlevel dielectric 34 function, in part, to define the gate or control electrode physical dimensions.

Figure 4:
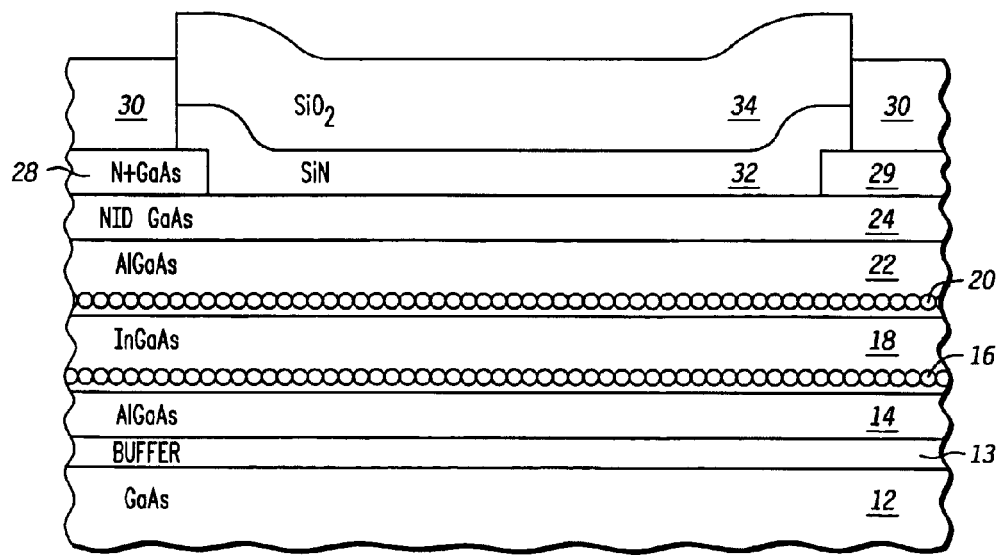

Illustrated in FIG. 4 is further processing of microwave field effect transistor 10 wherein a portion of the step gate dielectric 32 and the interlevel dielectric 34 are etched to create an opening for the formation of source/drain (S/D) ohmic contacts 30. In the illustrated form, the left-most contact of S/D ohmic contacts 30 is a source, and the right-most contact of S/D ohmic contacts 30 is a drain. The source/drain (S/D) ohmic contacts 30 are deposited on and overlie source region 28 and drain region 29, respectively. The source/drain ohmic contacts 30 are formed by depositing a layered structure of Ni, Ge and Au. This structure is then annealed to form a eutectic that penetrates into source region 28 and drain region 29 to complete formation of the S/D ohmic contacts 30. It should be apparent that layers of metals other than Ni, Ge and Au may be used.

Figure 5:
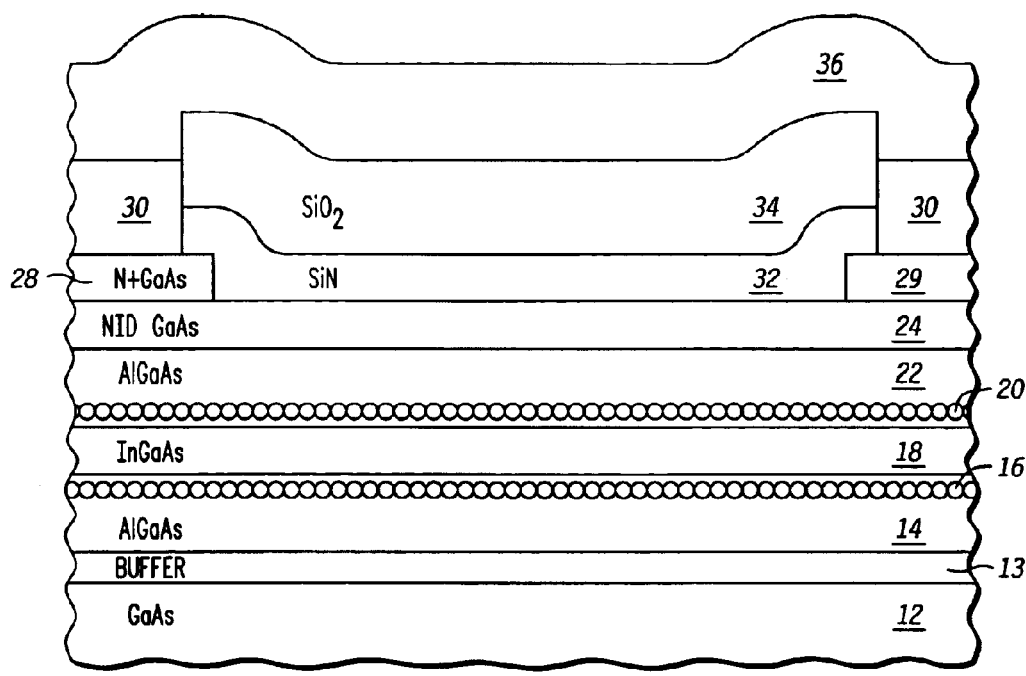

Illustrated in FIG. 5 is further processing of microwave field effect transistor 10 wherein a top dielectric layer 36 is formed overlying and on the interlevel dielectric 34 and the S/D ohmic contacts 30. It should be well understood that interlevel dielectric 34 and top dielectric layer 36 merge together since they are the same material and therefore the boundary between the two regions that were formed separately in time may not be easily detectable.

Figure 6:
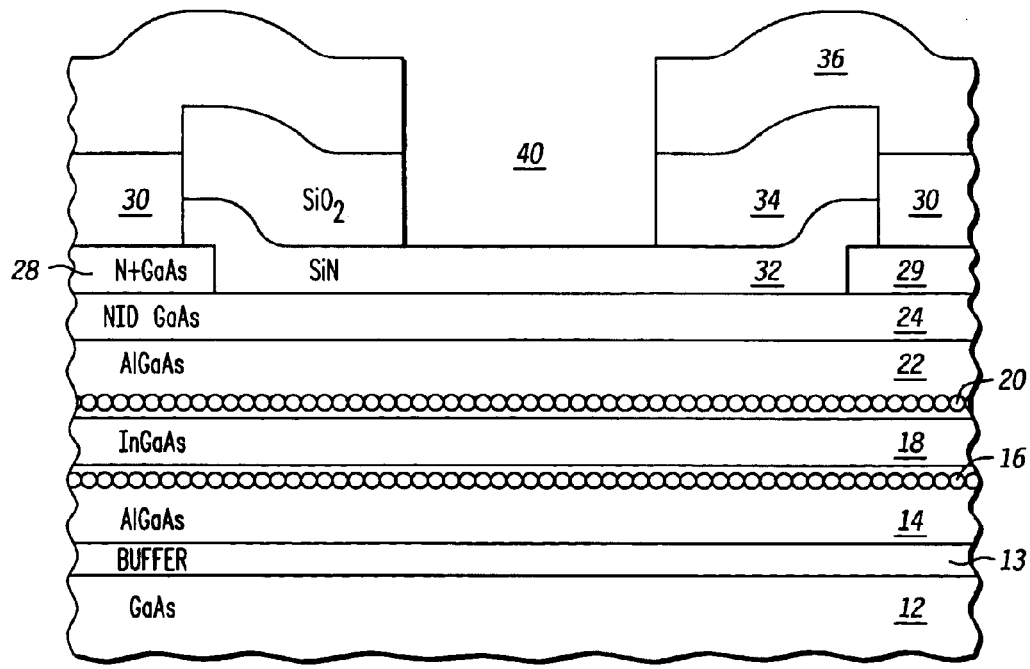

Illustrated in FIG. 6 is further processing of microwave field effect transistor 10 wherein a step gate opening 40 is formed in both the top dielectric layer 36 and the interlevel dielectric 34 within the first recess 27. The step gate opening 40 is formed between the source/drain ohmic contacts 30. Various conventional techniques may be used to implement an etch stop layer (not shown) that may be used to determine the point at which an etch operation is concluded without etching into the step gate dielectric 32. For example, a thin AIN layer (not shown) may be inserted between the step gate dielectric 32 and the interlevel dielectric 34 to function as an etch stop layer.

Figure 7:
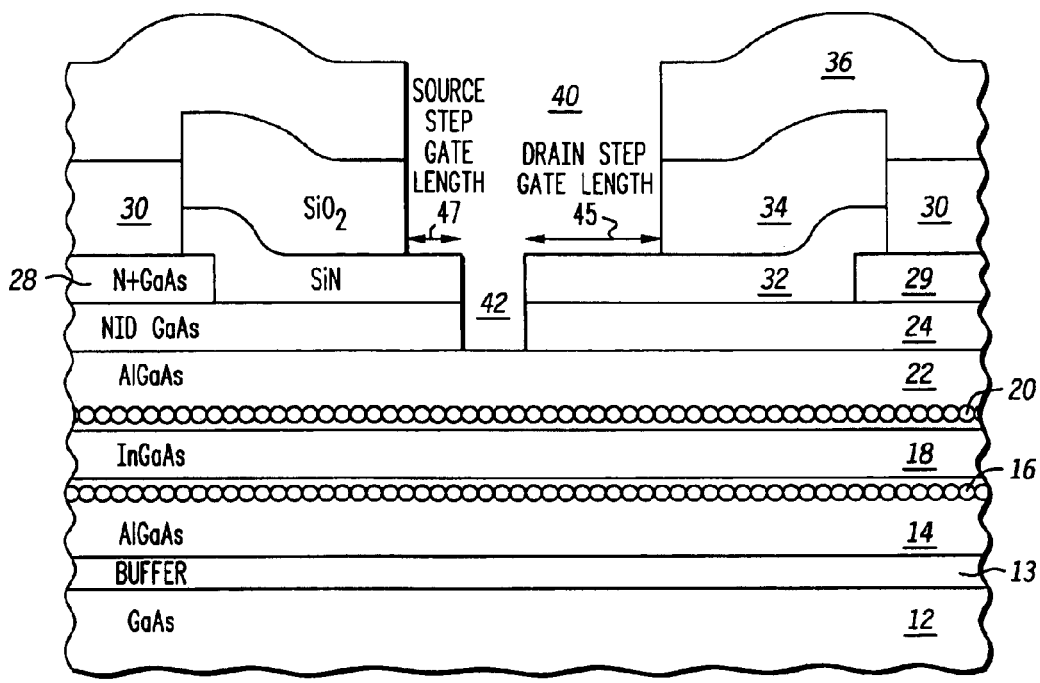

Illustrated in FIG. 7 is further processing of microwave field effect transistor 10 wherein a Schottky gate region defined by a Schottky gate opening 42 is formed below the step gate opening 40 and extends through the step gate dielectric 32 and the NID layer 24. The forming of the Schottky gate opening 42 includes at least defining a drain step gate length 45 that is illustrated in FIG. 7 to the right side of the Schottky gate opening 42. The drain step gate length 45 increases device breakdown voltage and reduces gate leakage current to the channel. The drain step gate length 45 is on the order of 0.5 to 1.5 $\mu$m. Other ranges may be used depending upon a thickness of step gate dielectric 32 and the NID layer 24. To the left side of the Schottky gate opening 42 is a source side step gate length 47. The source side step gate length 47 is much smaller than the drain step gate length 45 having a length that is limited by the ability to align with the step gate opening 40 and, for example, is on the order of 0.1 to 0.3 um. The source side step gate length 47 is made small to minimize additional gate capacitance.

Figure 8:
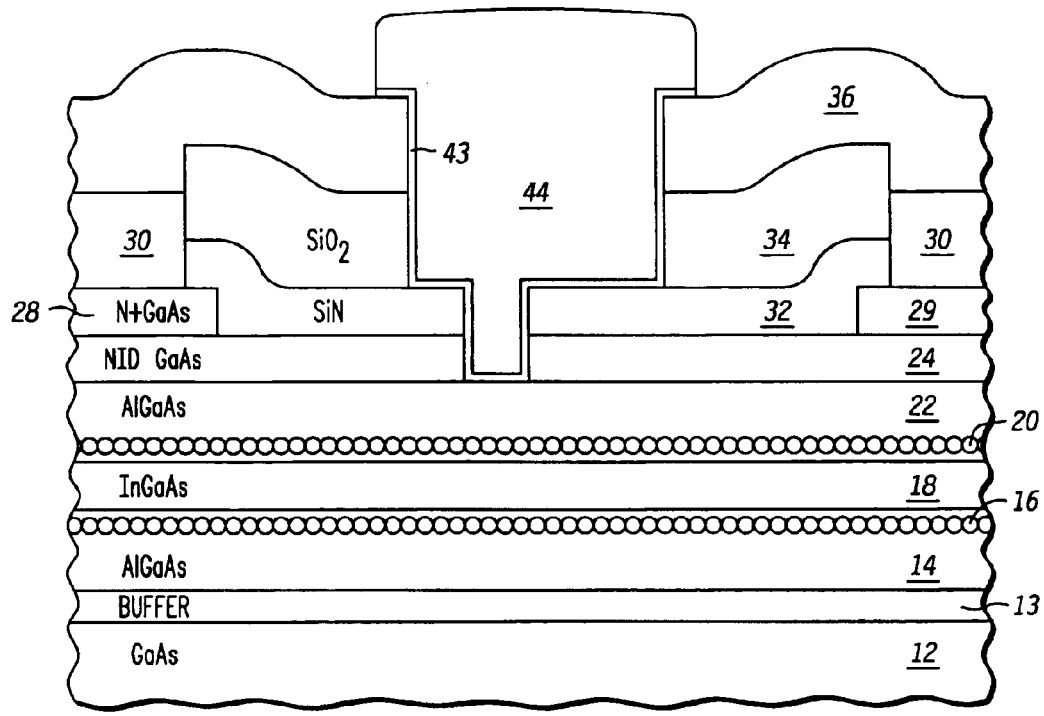

Illustrated in FIG. 8 is further processing of microwave field effect transistor 10 wherein a barrier metal layer 43 has been blanket deposited over microwave field effect transistor 10. In one form the barrier metal layer 43 is TiWN or other materials such as TiPtAu. The barrier metal layer 43 covers sidewalls of the step gate opening 40. A mask (not shown), such as photoresist, is provided to allow the formation of a metal, such as Au, within the step gate opening 40. The metal formation may be implemented in any of numerous ways including metal plating, deposition or evaporation. The formation of the gate metal provides a high conductivity gate 44 in FIG. 8 that extends above an upper surface of the top dielectric layer 36. Upon formation of the high conductivity gate 44, exposed portions of the barrier metal layer 43 are etched away so that only the portion of barrier metal layer 43 that interfaces the high conductivity gate 44 with surrounding materials is left. Barrier metal layer 43 prevents the high conductivity gate 44 from diffusing into any of the barrier layer 22, the NID layer 24, the step gate dielectric 32, the interlevel dielectric 34 and the top dielectric layer 36. It should be noted that electrical interconnect to each of the source/drain ohmic contacts 30 is made by any of numerous conventional techniques. For example in one form, a via (not shown) through the top dielectric layer 36 may be made to each of the source/drain ohmic contacts 30. In another form later interconnects that are perpendicular to the plane of view in FIG. 8 may be used to make electrical connection to each of the source/drain ohmic contacts 30.

Illustrated in FIG. 9 is a graph that illustrates the drain current, $I_D$, as a function of drain voltage, $V_D$, of microwave field effect transistor 10. In each of four illustrated circuit conditions, the microwave field effect transistor 10 is pushed to a limit so that to the right of the end of each illustrated curve, device failure is imminent. A plot that represents the drain current versus the drain voltage is illustrated by an RF loadline 51. Two extremes of RF operation are represented. These conditions are a conductive or "on" state 50 corresponding to high drain current ($V_G$=0V) at low drain voltage, and a non-conductive or "off" state 52, corresponding to very low drain current ($V_G$=−1.25V) at high drain voltage. For a thickness of 200 Angstroms of the recess layer or NID layer 24, curve 54 illustrates the response of drain current as drain voltage increases. To operate microwave field effect transistor 10 without a device failure during RF operation, it is necessary that the quiescent drain voltage, Vdq, is less than the point of failure shown for the on state 50. In the on state 50, when the recess layer or NID layer 24 is implemented with a thickness of 600 Angstroms as compared to 200 Angstroms, a significant increase in the amount of survivable drain voltage is realized. For example, for a thickness of 200 Angstroms, the microwave field effect transistor 10 will not survive a drain voltage of at least fifteen volts. In contrast, for a thickness of 600 Angstroms, approximately a two-fold improvement increase is realized. Therefore, it is important when implementing a step gate microwave transistor to implement the lower positioned recess layer (i.e. the recess layer that is etched second) having a thickness significantly greater than has previously been suggested in the literature for other step gate transistors. Use of a thickness of NID layer 24 that is significantly greater than 200 Angstroms significantly reduces negative effects of impact ionization that exists at the drain-side step between NID layer 24 and first recess layer 26. Because of the thickness of NID layer 24 and the fact that it is only lightly doped from subsequent infusion of dopant atoms, the NID layer 24 minimizes the electric field where it interfaces with the drain ohmic contact of S/D ohmic contacts 30 via the first recess layer 26. The reduced electric field at this point within microwave field effect transistor 10 minimizes the impact ionization generation of electron-hole pairs. It should be apparent that any of many thickness values for the NID layer 24 within a range may be used. For example, any thickness in a range of substantially 300 Angstroms to 700 Angstroms will provide enhanced drain voltage tolerance as compared with 200 Angstroms. However, there is a point in the increased thickness at which the increased thickness is not beneficial. In the off state 52, when NID layer 24 is implemented with a thickness of 600 Angstroms as compared to 200 Angstroms, a small increase in gate/drain current leakage is encountered, but at a very high drain voltage range. However, as illustrated in FIG. 9, this degradation has minimal practical effect on being able to operate microwave field effect transistor 10 at significantly high drain voltage.

FIG. 10 illustrates the off state gate/drain breakdown voltage versus the drain step gate length 45 as measured in microns. A range of step gate lengths between 0.5 and 1.5 microns is shown within a dashed box that illustrates a range of desired operation at 26 volts with minimal gate current leakage while maintaining desired voltage gain. Various curves illustrate the off state gate/drain breakdown voltage depending upon the thickness of NID layer 24. For example, curve 70 is associated with a thickness for NID layer 24 of 200 Angstroms. Curve 71 is associated with a thickness for NID layer 24 of 300 Angstroms. Curve 72 is associated with a thickness for NID layer 24 of 400 Angstroms, and curve 73 is associated with a thickness for NID layer 24 of 600 Angstroms. Directions 62, 64, 66 and 68 illustrate operation outside of the exemplary optimal range. For operation in either direction 62 or 64, excess gate leakage current occurs and efficiency as well as linearity is reduced. In a direction 68 away from the desired range thinner recess layers are used and therefore the viable (i.e. survivable) drain voltage is reduced as was shown in FIG. 9. In a direction 66 away from the desired range, the gate capacitance is increased which reduces the gain and efficiency of microwave field effect transistor 10. It should be understood that the data illustrated in FIG. 10 is specific to a predetermined set of certain physical characteristics for the structure of microwave field effect transistor 10. Analogous, but different valued results will exist by modifying the physical characteristics (e.g. type of materials, thickness of layers, etc.).

Illustrated in table form in FIG. 11 is a chart 80 that illustrates various transistor characteristics as the step gate length is varied with a drain voltage of twenty-six volts. The gate voltage is set to achieve a drain current that is ten percent of steady state drain current, $I_{dss}$ (current at which Vg is zero). As the step gate length is increased, the gain decreases. As the step gate length is increased, the saturated power density slightly decreases. As the step gate length is increased, the power added efficiency (PAE) also decreases somewhat. The PAE is generally a percentage of how much RF power is generated versus D.C. power is consumed. As the step gate length is increased, the gate leakage (IG) is reduced significantly while BVGDO (the off state gate/drain breakdown voltage) increases substantially. In summary, a tradeoff exists between RF power parameters and the step gate length. The gate current is reduced at a cost of transistor gain and power efficiency.

By now it should be appreciated that there has been provided a double recessed field effect transistor with an optimized lightly doped second recess layer (NID layer 24) combined with a high conductivity gate 44 placed over a dielectric layer (step gate dielectric 32) on both the source and drain sides of the gate. The disclosed microwave transistor is implemented without a doped channel layer 18. A doped channel results in reduced performance because the cores of the doping atoms are positioned in the channel. The cores have a fixed positive charge and therefore cause ionized impurity scattering of electrons. This ionized impurity scattering reduces electron velocity and consequently the frequency response is reduced and the on resistance of the channel is increased. In contrast, in the illustrated form, the channel layer 18 is not intentionally doped and therefore the channel has less ionized impurity scattering, improved electron velocity, lower on-resistance and improved frequency response. These features operate in combination with a thicker recess layer than previously used by conventional step gate transistors to provide significantly improved voltage range and efficiency.

In one form there has been disclosed a method of forming a microwave field effect transistor. A substrate is provided. A heterojunction structure overlies the substrate. A not intentionally doped (NID) layer is provided overlying the heterojunction structure. A heavily doped semiconductor layer overlies the NID layer. A first recess is formed within the heavily doped semiconductor layer, the first recess extending from a source region to a drain region of the microwave field effect transistor. A step gate dielectric is provided overlying the NID layer within the first recess. An interlevel dielectric is provided overlying the step gate dielectric. Source/drain (S/D) ohmic contacts are formed overlying respective source and drain regions. A top dielectric layer is formed overlying the interlevel dielectric layer and the S/D ohmic contacts. A step gate opening is formed in the top dielectric layer and the interlevel dielectric layer within the first recess between the source and drain regions. A Schottky gate opening is formed within the step gate opening, the Schottky gate opening extending through the step gate dielectric layer and the NID layer. A barrier layer is provided overlying a portion of the heterojunction structure and sidewalls of the NID layer and step gate dielectric within the Schottky gate opening. The barrier layer further overlies the step gate dielectric, the NID layer, a portion of the heterojunction structure, and sidewalls of the interlevel dielectric and the top dielectric within the step gate opening. A gate metal is provided overlying the barrier layer within the Schottky gate opening and within the step gate opening. Additionally, a buffer layer overlies the substrate. The substrate includes at least one of GaAs, GaN, InP, Si, SIC, or Sapphire. The heterojunction structure includes either a single or a double heterojunction structure. The heterojunction structure includes a material system including at least one of GaAs, GaN, and InP. The heterojunction structure includes an undoped channel layer with a material layer above and below the channel layer, the channel layer having a bandgap that is less than a bandgap of each material layer. Each material layer further includes a Si planar doping layer. The undoped channel layer includes at least one of GaAs or $In_xGa_{1-x}As$. In one form, the NID layer has a thickness on the order of greater than 400 angstroms. In another form the NID layer has a thickness on the order of 400 to 800 angstroms and the NID layer includes GaAs. The heavily doped semiconductor layer provides a low resistance ohmic contact on the order of approximately $1 \times 10^{-6}$ ohm cm$^2$. The heavily doped semiconductor layer is used for forming source and drain regions of the microwave field effect transistor. The step gate dielectric includes a thickness on the order of less than 2,000 angstroms and includes SiN. The interlevel dielectric is for use in forming the gate. Forming the S/D ohmic contacts includes alloying. In one embodiment, forming the S/D ohmic contacts further includes forming a layered structure of Ni, Ge, and Au and alloying the Ni, Ge, and Au layered structure. The Schottky gate opening is formed by at least defining a drain side step gate length wherein the drain side step gate length is on the order of approximately 0.5 to 1.5 μm. A portion of the step gate dielectric layer separates the step gate from a portion of the underlying NID layer on the drain side by at least the drain side step gate length. The barrier layer provides an adhesion layer and maintains a Schottky contact at elevated temperatures. In one form the barrier layer includes a refractory metal and is one of WSi, TiWN, TiPt, TiPd and others. The barrier layer further overlies a portion of the top dielectric and the interlevel dielectric outside of the step gate opening. The gate metal includes a low resistivity gate metal and includes at least one of gold, copper, aluminum, and silver.

In the foregoing specification, the invention has been described with reference to specific embodiments. However, one of ordinary skill in the art appreciates that various modifications and changes can be made without departing from the scope of the present invention as set forth in the claims below. For example, various materials may be used for the substrate and insulating layers. Various dopant concentrations, temperature and pressure ranges may be used depending upon the particular device parameters that are desired. While both an upper planar doping layer 20 and a lower planar doping layer 16 are illustrated, it should be apparent that in another form only the upper planar doping layer 20 may be used to provide adequate current conduction within channel layer 18.

Accordingly, the specification and figures are to be regarded in an illustrative rather than a restrictive sense, and all such modifications are intended to be included within the scope of the present invention. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a microwave field effect transistor comprising:

providing a substrate;

providing a heterojunction structure overlying the substrate, wherein the heterojunction structure includes an undoped channel layer with at least one selected from the group consisting of a material layer above, a material layer below, and a material layer above and below the undoped channel layer, the undoped channel layer having a bandgap less than a bandgap of each material layer;

providing a not intentionally doped (NED) layer overlying the heterojunction structure;

providing a heavily doped semiconductor layer overlying the NID layer;

forming a first recess within the heavily doped semiconductor layer, the first recess extending from a source region to a drain region of the microwave field effect transistor;

providing a step gate dielectric overlying the NID layer within the first recess;

providing an interlevel dielectric layer overlying the step gate dielectric;

forming source/drain (S/D) ohmic contacts respectively overlying the source region and the drain region;

forming a top dielectric layer overlying the interlevel dielectric layer and the S/D ohmic contacts;

forming a step gate opening in the top dielectric layer and the interlevel dielectric layer within the first recess between the source region and the drain region;

forming a Schottky gate opening within the step gate opening, the Schottky gate opening extending through the step gate dielectric layer and the NID layer;

providing a barrier metal layer overlying a portion of the heterojunction structure and sidewalls of the NID layer and step gate dielectric within the Schottky gate opening, the barrier metal layer further overlying the step gate dielectric, the NID layer, a portion of the heterojunction structure, and sidewalls of interlevel dielectric and top dielectric within the step gate opening; and providing a gate metal overlying the barrier metal layer within the Schottky gate opening and within the step gate opening.

2. The method of claim 1, wherein providing the substrate further includes providing a buffer layer overlying the substrate.

3. The method of claim 1, wherein the substrate includes at least one selected from the group consisting of a GaAs, GaN, InP, Si, SiC, and Sapphire.

4. The method of claim 1, wherein the heterojunction structure includes a material system including at least one of GaAs, GaN, and InP.

5. The method of claim 1, wherein each material layer further includes a planar doping layer.

6. The method of claim 5, wherein the planar doping layer includes a Si planar doping layer.

7. The method of claim 1, wherein the undoped channel layer includes at least one selected from the group consisting of GaAs, $In_xGa_{1-x}As$, and $In_xGa_{1-x}N$.

8. The method of claim 1, wherein the NID layer has a thickness on the order of greater than 400 angstroms.

9. The method of claim 8, further wherein the NID layer has a thickness on the order of 400 to 800 angstroms.

10. The method of claim 1, wherein the NID layer includes GaAs.

11. The method of claim 1, wherein the heavily doped semiconductor layer provides a low resistance ohmic contact on the order of approximately $1 \times 10^{-6}$ ohm cm$^2$.

12. The method of claim 11, wherein the heavily doped semiconductor layer is used for forming source and drain regions of the microwave field effect transistor.

13. The method of claim 1, wherein the step gate dielectric includes a thickness on the order of less than 2,000 angstroms.

14. The method of claim 1, wherein the step gate dielectric includes SiN.

15. The method of claim 1, wherein the interlevel dielectric is for use in forming the gate.

16. The method of claim 15, wherein the interlevel dielectric includes a thickness on the order of 500 to 20,000 angstroms.

17. The method of claim 1, wherein forming the S/D ohmic contacts includes alloying.

18. The method of claim 1, wherein forming the S/D ohmic contacts further includes forming a structure of Ni, Ge and Au.

19. The method of claim 18, still further including alloying the Ni, Ge, and Au layered structure.

20. The method of claim 1, wherein forming the Schottky gate opening includes least defining a drain side step gate length.

21. The method of claim 20, wherein the drain side step gate length is on the order of approximately 0.5 to 1.5 micron.

22. The method of claim 20, wherein a portion of the Step gate dielectric layer separates the step gate from an underlying portion of the NID layer on a drain side by at least the drain side step gate length.

23. The method of claim 1, wherein the barrier metal layer provides at least one selected from the group consisting of an adhesion layer, and maintaining a Schottky contact at elevated temperatures of the microwave field effect transistor.

24. The method of claim 1, wherein the barrier metal layer includes a refractory metal.

25. The method of claim 1, wherein the barrier metal layer includes one selected from the group consisting of WSi, TiWN, TiPt and TiPd.

26. The method of claim 1, wherein the barrier metal layer further includes overlying a portion of the top dielectric layer and the interlevel dielectric outside of the step gate opening.

27. The method of claim 1, wherein the gate metal includes a low resistivity gate metal.

28. The method of claim 1, wherein the gate metal includes at least one selected from the group consisting of gold, copper, aluminum, and silver.

29. A method of forming a microwave field effect transistor comprising:

providing a substrate;

providing a heterojunction structure overlying the substrate, wherein the heterojunction structure includes an undoped channel layer with a material layer above and below the undoped channel layer, the undoped channel layer having a bandgap less than a bandgap of each material layer and each material layer including a planar doping layer, further wherein the heterojunction structure includes a material system including at least one of GaAs, GaN, and InP;

providing a not intentionally doped (NID) layer overlying the heterojunction structure;

providing a heavily doped semiconductor layer overlying the NID layer;

forming a first recess within the heavily doped semiconductor layer, the first recess extending from a source region to a drain region of the microwave field effect transistor;

providing a step gate dielectric overlying the NID layer within the first recess;

providing an interlevel dielectric layer overlying the step gate dielectric;

forming source/drain (S/D) ohmic contacts overlying respective source and drain regions;

forming a top dielectric layer overlying the interlevel dielectric layer and the S/D ohmic contacts;

forming a step gate opening in the top dielectric layer and the interlevel dielectric layer, within the first recess between the source and drain regions;

forming a Schottky gate opening within the step gate opening, the Schottky gate opening extending through the step gate dielectric layer and the NID layer;

providing a barrier metal layer overlying a portion of the heterojunction structure and sidewalls of the NID layer and step gate dielectric within the Schottky gate opening, the barrier, metal layer further overlying the step gate dielectric, the NID layer, a portion of the heterojunction structure, and sidewalls of Interlevel dielectric and top dielectric within the step, gate opening; and providing a gate metal overlying the barrier metal layer within the Schottky gate opening and within the step gate opening.

30. The method of claim 29, wherein the NID layer includes a GaAs layer having a thickness on the order of 400 to 800 angstroms.

* * * * *

UNITED STATES PATENT AND TRADEMARK OFFICE
CERTIFICATE OF CORRECTION

PATENT NO. : 6,867,078 B1
DATED : March 15, 2005
INVENTOR(S) : Green et al.

It is certified that error appears in the above-identified patent and that said Letters Patent is hereby corrected as shown below:

<u>Title page,</u>
Item [74], *Attorney, Agent, or Firm*, change "Bolconi-Lamica" to -- Balconi-Lamica --.

<u>Column 8,</u>
Line 24, change "(NED)" to -- (NID) --.

<u>Column 9,</u>
Line 41, change "Step" to -- step --.

Signed and Sealed this

Eleventh Day of April, 2006

JON W. DUDAS
*Director of the United States Patent and Trademark Office*